(12) United States Patent
Easter et al.

(10) Patent No.: US 6,202,295 B1
(45) Date of Patent: Mar. 20, 2001

(54) METHOD AND TOOL THAT REMOVES AN ELECTRICAL CONNECTING BLOCK FROM A TELECOMMUNICATIONS BOARD

(75) Inventors: William Easter; Dale Evans; John Maze; Frank Miceli, all of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/378,428

(22) Filed: Aug. 20, 1999

(51) Int. Cl.[7] .................................................. B23P 19/00
(52) U.S. Cl. .............................................. 29/764; 29/762
(58) Field of Search .............................. 29/741, 764, 758, 29/267, 268, 762

(56) References Cited

U.S. PATENT DOCUMENTS

| | | | |
|---|---|---|---|
| 3,584,525 | 6/1971 | Caveney et al. | 81/3 |
| 3,778,750 | 12/1973 | Caveney et al. | 339/97 R |
| 3,964,148 | * 6/1976 | Sturtevant | 29/203 |
| 4,756,078 | * 7/1988 | Dougherty et al. | 29/764 |
| 5,658,166 | 8/1997 | Freeman et al. | 439/540.1 |
| 5,771,945 | 6/1998 | Jenner et al. | 140/123 |

* cited by examiner

Primary Examiner—Lee Young
Assistant Examiner—Sean Smith
(74) Attorney, Agent, or Firm—Allen, Dyer, Doppelt, Milbrath & Gilchrist, P.A.

(57) ABSTRACT

A method of removing a connecting block from a wiring block and associated tool is disclosed. A rear surface of a telecommunications board is mounted adjacent to a support surface and forms a plenum between the wiring block and support surface where cable-pair conductors are contained. Male connectors are mounted on the telecommunications board and terminate the cable-pair conductors. Female connecting blocks are complementary fitting to the male connectors and include clips that slice through insulation on cable-pair conductors. The female connecting blocks include opposing attachment legs that engage the male connectors. The attachment legs of the connecting block are engaged with the removal tool having opposing lever arms that form pivoting jaws at one end and engage the opposing attachment legs. The opposing lever arms are depressed to spread outward the pivoting jaws and the attachment legs. The removal tool is pulled upward such that the connecting block is removed from the wiring block.

2 Claims, 4 Drawing Sheets

METHOD AND TOOL THAT REMOVES AN ELECTRICAL CONNECTING BLOCK FROM A TELECOMMUNICATIONS BOARD

FIELD OF THE INVENTION

This invention relates to the field of wiring blocks that secure and organize cable-pair conductors, and more particularly, this invention relates to a method and a tool that removes a connecting block used for slicing through the insulation on cable-pair conductors of a wiring block.

BACKGROUND OF THE INVENTION

The administration and equipment rooms of major telecommunication centers, office complexes and some residential homes typically include an electrical closet or other electrical wiring area having wiring frames that secure and organize many different cable-pair conductors. For example, Lucent Technologies manufactures a wiring block for GIGA speed-category 5 applications under the trade designation "110," which can be mounted either directly on the walls or support surfaces in electrical closets, or mounted on a 110D wiring block mounted on a frame-mount application. This wiring block allows high density applications. These wiring blocks can be about 10" or 11" in width and have a height of about 3.5". Index strips can extend across the wiring blocks and secure and organize up to 25 colored cable-pair conductors. The index strips are typically marked with different colors to help locate the color coded cable-pair conductors. The strips have pairs that are formed as male connectors that are color coded for receiving and matching different color coded cable-pair conductors in predetermined locations on the strips. A category 5 connecting block, such as the 110C connecting block from Lucent Technologies, can be formed as a three-pair, four-pair or five-pair connecting block. It is usually formed as a one-piece, fire-retardant, molded plastic housing that contains solder-plated quick clips that slice through the insulation on conductors as the connecting blocks are pushed onto the wiring block. The connecting blocks typically include attachment legs that grasp onto the male component of the wiring block.

In the past, if a connecting block was removed, then excessive force had to be applied onto the connecting block via a pair of pliers, which could damage the wires and assemblies, and the entire connection assembly. In addition, the use of excessive force restricted personnel who had motor skill/strength components.

SUMMARY OF THE INVENTION

It is therefore an object of the present invention to provide a method and corresponding tool that allows a connecting block as described above to be removed from a wiring block without damaging the cable-pair conductors and other assemblies.

In accordance with the present invention, a novel and unobvious method is provided for removing a connecting block from a wiring block formed as a telecommunications board having front and rear surfaces. The rear surface is mounted adjacent to a support surface and forms a plenum between the telecommunications board and support surface where cable-pair conductors are contained. A plurality of male connectors are mounted on the telecommunications board and terminate in cable pair conductors. The male connectors are color coded for receiving and matching different colored coded cable pair conductors in predetermined locations.

A plurality of female connecting blocks are complementary fitting to the male connectors and include clips that slice through the insulation on the cable pair conductors. The female connecting blocks include opposing attachment legs that engage the male connectors for retaining the female connecting block onto the male connectors.

In one aspect of the present invention, the method comprises the further step of engaging the attachment legs of the connecting block with a removal tool having opposing lever arms that form pivoting jaws at one end and engage opposing attachment legs with the pivoting jaws. The opposing lever arms are depressed to spread outward the pivoting jaws and the attachment legs of the connecting block that are engaged by the pivoting jaws. The removal tool is pulled upward such that the connecting block is removed from the wiring block.

In still another aspect of the present invention, the opposing lever arms are formed as handles, and the step of depressing opposing lever arms comprises the step of manually depressing the handles. The removal tool can also include a base housing that rests against the telecommunications board. A drive mechanism is movably mounted within the housing and engages the lever arms for depressing the lever arms and spreading the pivoting jaws while also pulling upward on the lever arms for removing the connecting block from the wiring block.

The drive mechanism can include a slidable mounting arm movably mounted within the housing that engages the opposing lever arms and depresses and pulls upward on the lever arms. The pivoting jaws can further comprise a hook connecting against the connecting block. The telecommunications board can further comprise support legs that extend from the telecommunications board for supporting the telecommunications board against a support surface.

In still another aspect of the present invention, the telecommunications board can further comprise a plurality of horizontally extending index strips that extend across the telecommunications board. The index strips include areas that form the male connectors and are typically marked with tip colors to help locate different color coded cable pair conductors quickly. The connectors can typically accommodate 22–26 gauge conductors. In accordance with the present invention, a removal tool removes the connecting block from the wiring block.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because it now allows a connecting block to be removed from a wiring block without damaging the cable-pair conductors and other assembly components on the wiring block. It is also good because you can remove a connecting block with minimum force. The use of the special removal tool in combination with the connecting block and wiring block is advantageous.

Figure 1:
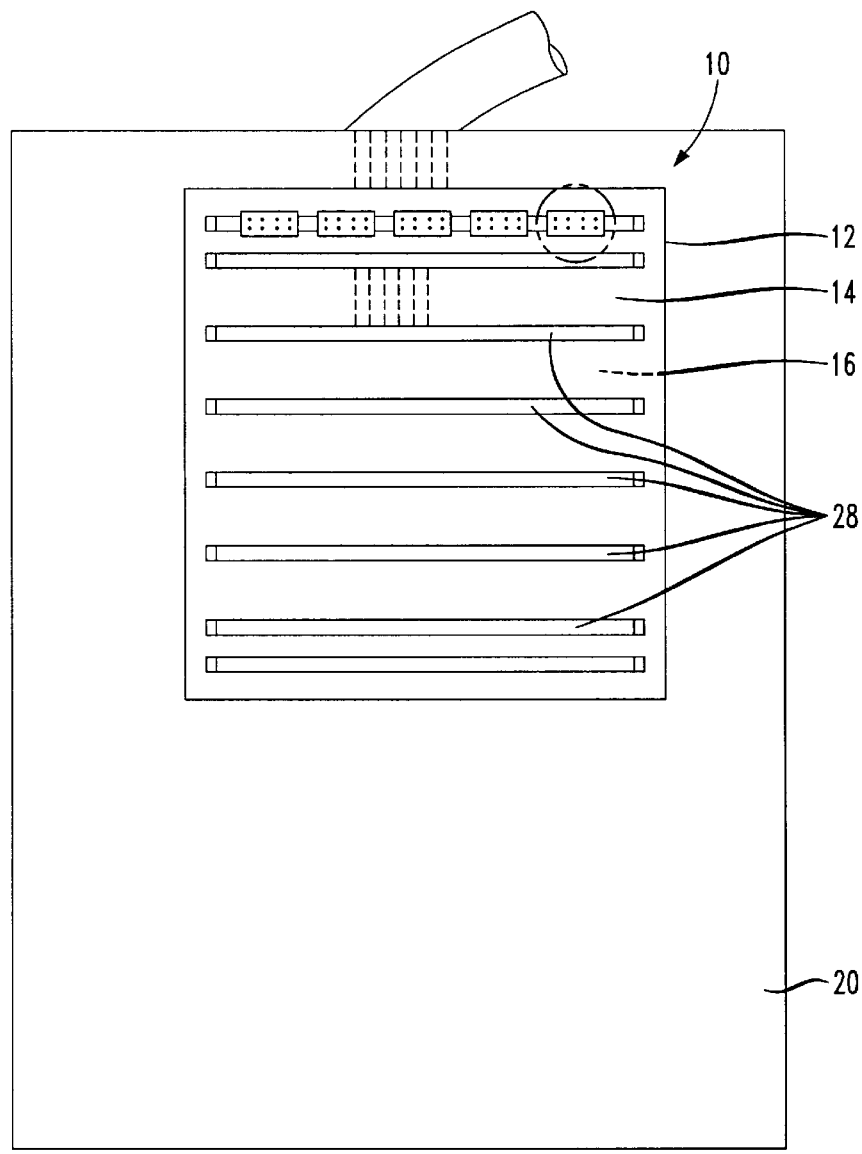
FIG. 1 illustrates a schematic, front elevation view of a wiring block mounted against a support surface in an electrical closet, and five connecting blocks connected onto a strip of the wiring block.
Figure 2:
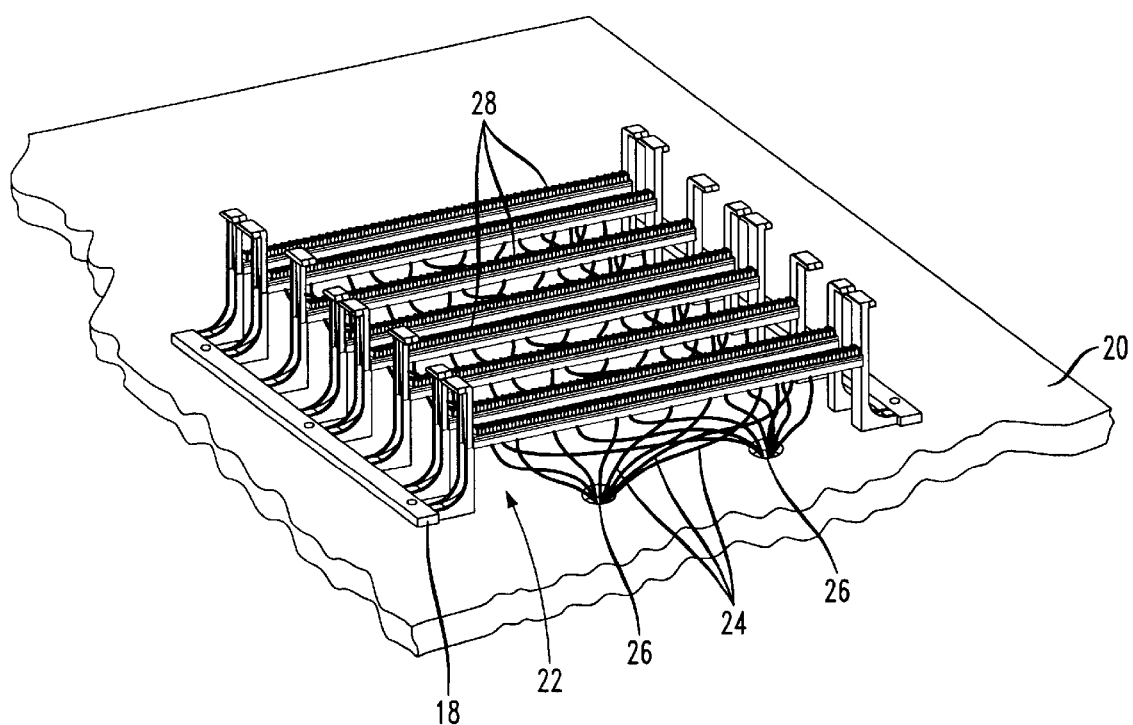
FIG. 2 is an isometric view of a wiring block that can be used with the method of the present invention.
Figure 3:
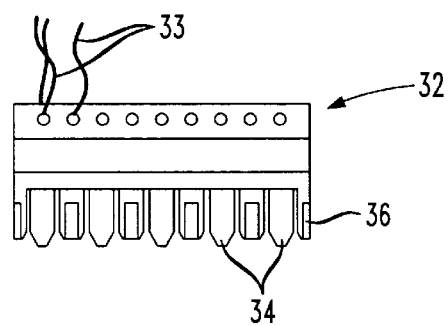
FIG. 3 is an isometric view of a connecting block that can be used with the method of the present invention.

FIG. 1 illustrates a wiring block 10, such as a 110 wiring block, that is a GIGA speed-category 5 wiring block, such as produced by Lucent Technologies. As illustrated, the wiring block 10 comprises a telecommunications board 12 having front 14 and rear surfaces 16 (FIG. 2). A series of support legs 18 are provided on the rear surface 16 of the telecommunications board 12 and are used to mount the telecommunications board onto a support surface 20, such as a wall in an electrical closet, as known to those skilled in the art. The rear surface 16 is seen as mounted adjacent to the support surface 20 and forms a plenum 22 between the telecommunications board 12 and the support surface where cable-pair conductors 24 contained in wire trunks 26 can be contained.

Figure 1A:
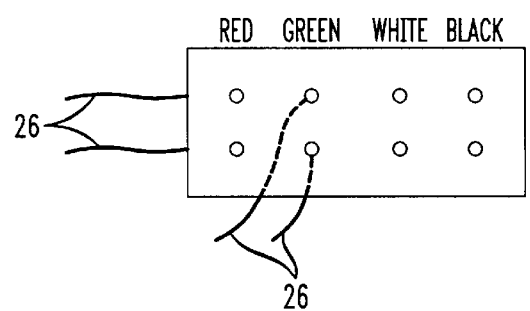
FIG. 1A is a schematic plan view of a connecting block showing the different colored combinations of cable pair conductors that have been terminated.

The dimensions of wiring blocks 10 can vary, and often are found in 25, 50, 100 and 300 cable-pair wiring blocks. Typically, a telecommunications board has horizontal index strips 28 that secure and organize a plurality of cable-pair conductors, e.g., 25 cable-pair conductors each. The index strips 28 are marked with different colors that help locate the cable-pair conductors easily. As is well known to those skilled in the art, cable-pair conductors are color coded to allow proper connection of the cable-pair conductors (FIG. 1A). The index strips 28 include formed areas that contain male connectors 30 that are color coded to receive the cable-pair conductors. As an example of different dimensions, a 100 pair wiring block 10 could have a height of about 3.625 inches, and a 300 pair wiring block could have a height of about 10.75 inches. The width of both wiring blocks could be about 10.75 inches and have a depth of about 3.25 inches. When the wiring block is used on a frame-mount application, such as a separate frame and not a support surface such as a wall, then the support legs would not be required because the frame would have the requisite mounts for mounting the wiring block.

Figure 4:
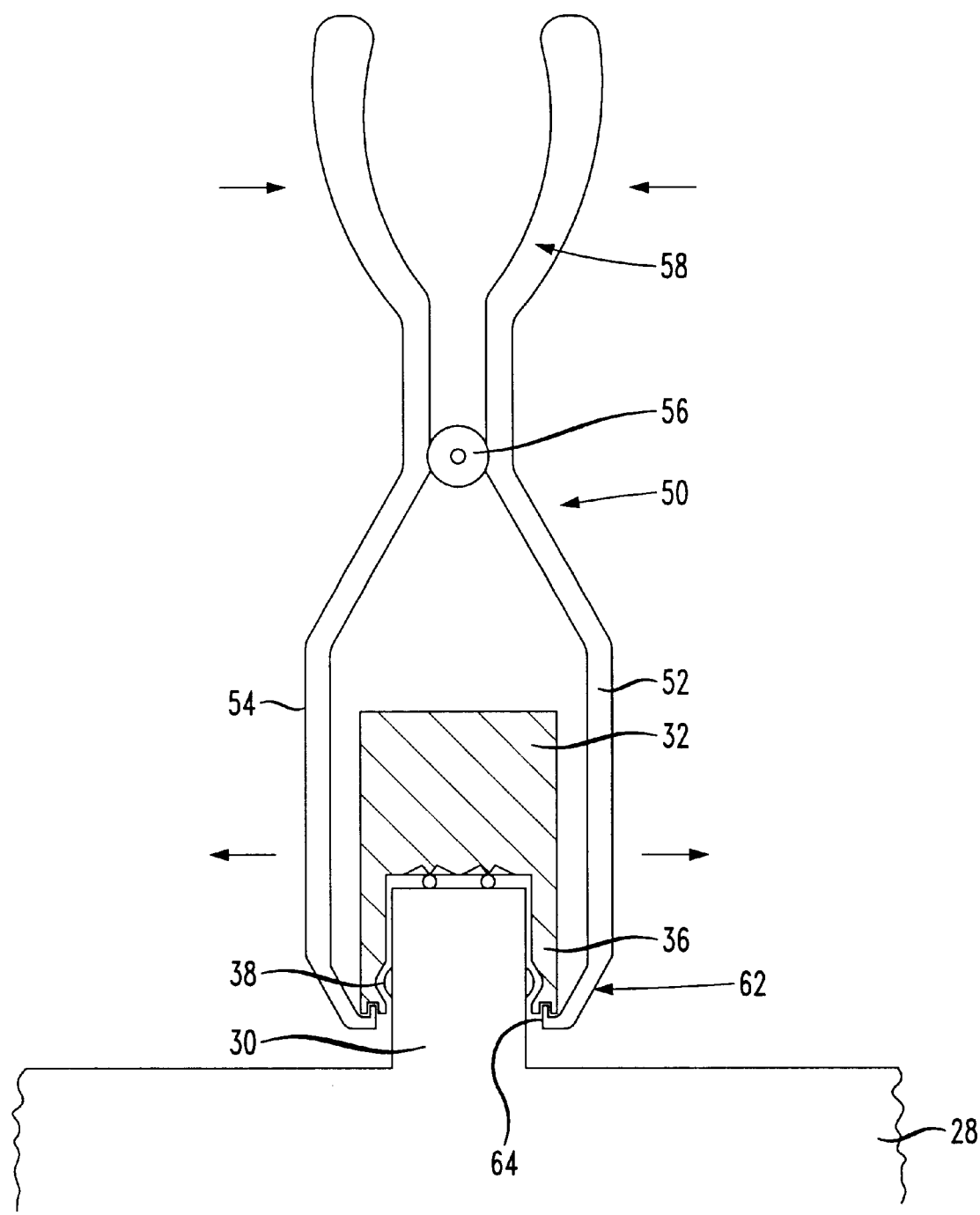
FIG. 4 is a schematic view of the removal tool in accordance with one aspect of the present invention.

A complementary fitting female connecting block 32 includes wire clips 34 that slice through the insulation on cable-pair conductors 24. The female connecting blocks 32 include opposing attachment legs (FIGS. 4 and 5) that engage the male connectors 30 of the wiring block for retaining the female connecting block onto the male connectors 30. The attachment legs 36 can engage protrusions 38 and be pivoted against the male connectors. An example of a connecting block 32 is a connecting block sold by Lucent Technologies under the trade designation 110C. The connecting blocks 32 can come in three-pair, four-pair and five-pair connecting blocks. The connecting blocks are preferably formed from a one-piece, fire-retardant, molded plastic housing that contains a solder-plated quick wire clip 34 to slice through the insulation on cable-pair conductors 24 as the connecting blocks are pushed onto the wiring block and the male connectors.

The connecting blocks are typically formed as double-ended blocks. One end of the double-ended blocks may accept 22–26 gauge hook-up wire 33 and the other end would terminate the cable-pair conductors 24. The connecting blocks 32 fasten onto the male connectors 30 and provide an electrically tight connection between cable-pair conductors that terminate on the wiring block and hook-up wire or patch cords. The connecting blocks could include clips to terminate 22–26 gauge PIC or PVC wires without removing the insulation.

Typical dimensions of a three-pair connecting block could have a height of about 0.25 inches, a width of about 0.9 inches, and a depth of about 1.0 (one) inch. The attachment legs 36 are biased inward against the male connectors to retain the connecting block against the wiring block male connectors.

In accordance with the present invention (FIG. 4), a removal tool 50 now allows removal of the female connecting blocks 32 without applying excessive force and damaging the connecting blocks. In one aspect of the present invention, the removal tool 50 includes two lever arms 52,54 that are connected together at a medially located pivot point 56 at one end in a predetermined location to form two handles 58 (such as in a pair of pliers) and pivoting jaws 62 at the other end. The pivoting jaws 62 are located at a lower end of the removal tool 50 and includes a hook 64 at each end that connects against the connecting block and fits underneath the attachment legs 36 as shown in FIG. 2. The formed handles are then depressed to extend the pivoting jaws slightly outward a predetermined distance, which is based upon the location of the pivot point 56. Thus, the pivot point 56 can be located adjacent the pivoting jaws such that depression of the handles allows the pivoting jaws to extend outward only a small amount, enough only to allow the attachment legs 36 to extend outward and permit removal of the connecting block by pulling upward on the removal tool and removing the connecting block from the male connector.

Figure 5:
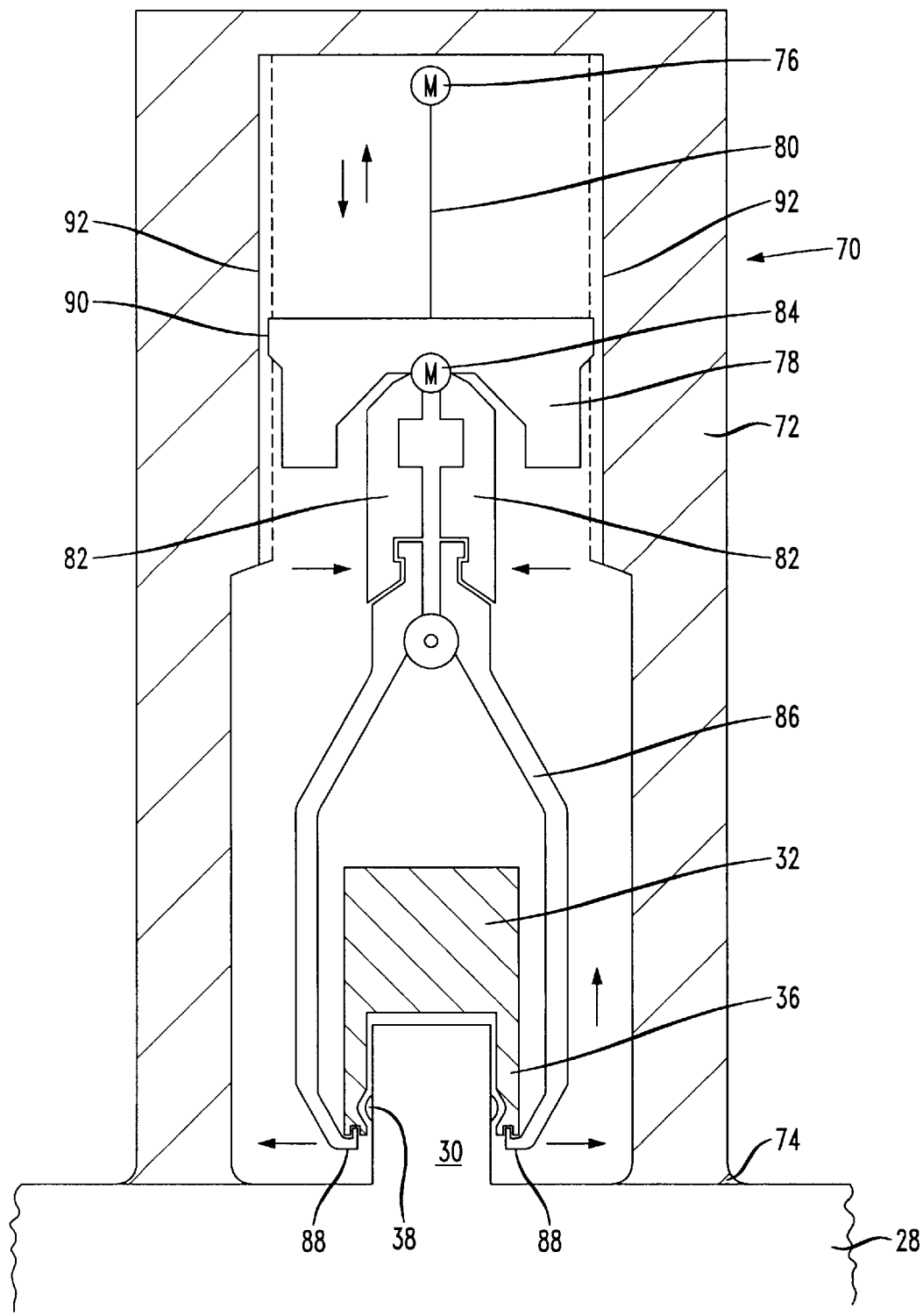
FIG. 5 is a schematic view of a removal tool in accordance with another aspect of the present invention that engages a connecting block and has a housing end that engages the telecommunications board.

In still another aspect of the present invention shown in FIG. 5, the removal tool 70 is motorized and includes a housing 72 having a base 74 that rests against the telecommunications board 12. Thus, the housing 72 could be different shapes and could be substantially cylindrically formed. A motor 76, such as a DC voltage electric motor, is mounted in the top portion of the housing. A drive mechanism 78 can be movably mounted within the housing 72 and can be connected to a drive transmission 80 of the motor 76. The drive mechanism 78 includes a pivoting output member 82 of another motor 84 that forms lever arms 86 and pivoting jaws 88, such that when the motor 84 is actuated, the drive mechanism 78 depresses the lever arms 86 and spreads outward the pivoting jaws 88. The motor 76 moves upward the drive mechanism and motor 84 and lever arm 86, pulling upward on the lever arms for removing the connecting block from the wiring block. The drive mechanism can include a slidable mounting arm 90 that movably engages an interior track 92 formed within the housing.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. A removal tool for removing a female connecting block from a male connector when said female connecting are complementary fitting to the male connectors, wherein said female connecting blocks include opposing attachment legs that bias inward and engage said male connectors for retaining said female connecting block onto the male connectors, said removal tool comprising:

a housing having a base for resting against a surface that supports the male connectors;

a pair of opposing lever arms having an end that forms pivoting jaws for engaging the attachment legs of a female connector block, and wherein said pivoting jaws each further comprise a hook member to capable of connection against the attachment legs of the female connecting block to retain the pivoting jaws against the attachment legs, wherein as said opposing lever arms are depressed, said pivoting jaws and retained attachment legs spread outward unbiasing the attachment legs of the female connecting block to the male connector; and a drive mechanism supported by and movably mounted vertically within said housing and engaging said lever arms for depressing the lever arms and spreading outward the pivoting jaws and also moving upward the lever arms for removing the female connecting block from the male connector when the attachment legs of the female connecting block are unbiased against the male connector.

2. The removable tool according to claim 1, wherein said drive mechanism further comprises a slidable mounting arm movable mounted within said housing that engages said opposing lever arms for depressing and pulling upward on the lever arms.

* * * * *

UNITED STATES PATENT AND TRADEMARK OFFICE
CERTIFICATE OF CORRECTION

PATENT NO. : 6,202,295 B1
DATED : March 20, 2001
INVENTOR(S) : Easter et al.

It is certified that error appears in the above-identified patent and that said Letters Patent is hereby corrected as shown below:

Column 4,
Line 65: Delete: "from a male connector when said female connecting are"
substitute: -- from a male connector when said female connecting blocks are --

Column 5,
Line 10: Delete: "member to capable of connection against the ..." substitute:
-- member to connect against the ... --

Signed and Sealed this

Twenty-eighth Day of August, 2001

Attest:

*Nicholas P. Godici*

NICHOLAS P. GODICI
*Attesting Officer*    *Acting Director of the United States Patent and Trademark Office*